United States Patent [19]
Diazzi et al.

[11] Patent Number: 5,572,156
[45] Date of Patent: Nov. 5, 1996

[54] CONTROL CIRCUIT WITH A LEVEL SHIFTER FOR SWITCHING AN ELECTRONIC SWITCH

[75] Inventors: Claudio Diazzi, Milan; Fabrizio Martignoni, Varese; Mario Tarantola, Milan, all of Italy

[73] Assignee: SGS-Thomson Microelectronics S.r.l., Agrate-Brianza, Italy

[21] Appl. No.: 529,883

[22] Filed: Sep. 18, 1995

[30] Foreign Application Priority Data

Sep. 16, 1994 [EP] European Pat. Off. .............. 94830435

[51] Int. Cl.$^6$ ............................ H03K 3/00; H03K 17/16
[52] U.S. Cl. ...................... 327/109; 327/217; 327/382; 327/384; 327/427
[58] Field of Search ................................... 327/199–201, 327/215–222, 310, 312, 379, 382, 384, 387–389, 427, 430–437, 327, 328, 108–112; 326/21, 26, 27, 82–87

[56] References Cited

U.S. PATENT DOCUMENTS

| | | | |
|---|---|---|---|
| 4,498,021 | 2/1985 | Uya | 326/86 |
| 4,677,324 | 6/1987 | Ronan, Jr. et al. | 327/377 |
| 4,937,468 | 6/1990 | Shekhawat et al. | 327/108 |
| 4,942,309 | 7/1990 | Chieli | 327/109 |
| 5,105,099 | 4/1992 | Routh et al. | 307/270 |
| 5,126,603 | 6/1992 | Hattori | 307/571 |
| 5,134,322 | 7/1992 | Bourgeois et al. | 327/381 |
| 5,365,118 | 11/1994 | Wilcox | 327/109 |

FOREIGN PATENT DOCUMENTS

| | | | |
|---|---|---|---|
| 0330628 | 8/1989 | European Pat. Off. | H03K 17/06 |
| 0397241 | 11/1990 | European Pat. Off. | H03K 17/16 |

OTHER PUBLICATIONS

Anonymous, "Double circuit de commande pour MOSFET de puissance ou IGBT haute tension," *Electronic Applications* 63:33–38, Dec. 1988, Paris, France.

*Primary Examiner*—Toan Tran
*Attorney, Agent, or Firm*—David V. Carlson; Harry K. Ahn; Seed and Berry LLP

[57] ABSTRACT

A control circuit for a power transistor, connected between two supply terminals in series with a load. The control circuit comprises a control logic circuit which produces a signal at two levels with respect to a reference terminal, a level shifter connected between the control circuit and the power transistor, which produces a signal at two levels relative to the node between the power transistor and the load. The level shifter comprises a flip-flop the output of which controls the power transistor, and an electronic switch, for example a MOSFET transistor, connected between the "set" input of the flip-flop and the node and controlled by the "reset" input of the flip-flop in such a way as to be closed when the "reset" input is greater, by a predetermined value, than that of the node. The electronic switch prevents the parasitic current flowing through the set and reset inputs from erroneously switching the power transistor.

15 Claims, 3 Drawing Sheets

Fig. 1 *(PRIOR ART)*

CONTROL CIRCUIT WITH A LEVEL SHIFTER FOR SWITCHING AN ELECTRONIC SWITCH

CROSS-REFERENCE TO RELATED APPLICATION

This application is being filed concurrently with a related U.S. patent application entitled "An Integrated Control Circuit With a Level Shifter For Switching an Electronic Switch", No. 08/529,882, (Seed and Berry Docket No. 851063.413).

TECHNICAL FIELD

The present invention relates to switching control circuits for electronic power switches and, more particularly, to a circuit of this type including a control signal level shifter.

BACKGROUND OF THE INVENTION

One known application of electronic power switches is in forming bridge circuits for the actuation of motors. These circuits include pairs of electronic switches connected in series between the poles of a high voltage power supply. The load, in this case a winding of the motor, is connected between the connection points of the pairs of switches. The switches of each pair are controlled in such a way that at any instant at most one of the two is closed. That is to say that both switches of a pair cannot be simultaneously closed.

The electronic switches are controlled by low voltage logic circuits which produce control signals at two levels relative to a reference voltage which, normally, is also the earth terminal of the circuit arrangement. For controlling the switches of the bridge connected to the positive pole of the power supply, the level of the logic circuit signals is shifted by means of suitable level shifter circuits.

A typical structure of a control circuit with a level shifter is schematically represented in FIG. 1. Four power transistors, for example, field effect transistors (FET) of n channel DMOS type, indicated as T1, T2, T3 and T4 are connected in series in pairs between the terminals, indicated with the earth symbol and $V_H$, of a relatively high voltage DC power supply, for example 300 volts. A load L, for example a winding of a motor, is connected between the connection nodes of the switches of the two pairs. A control logic circuit, indicated as LG, produces control signals at two voltage levels, for example the ground level, or zero, and a relatively low supply voltage level $V_{LL}$, typically five volts. These signals, available on the outputs of supply voltage level $V_{LL}$, typically five volts. These signals, available on the outputs of the logic circuit LG are applied to the control terminals, that is to say the gate electrodes both of the "lower" transistors T2, T4 through respective driving circuits, and the "upper" transistors T1, T3, through respective level shifting and driving circuits, to switch the transistors on or off (conduction or cut-off) according to the sequence determined by the logic circuit LG. For simplicity of the drawing, only the driving circuits DR1 and DR2 for the transistors T1 and T2 and only the level shifter LS1 relating to the transistor T1 are shown; it is understood that similar circuits are provided for control of the transistors T3 and T4.

The driving circuit (DR2) of the transistor T2 is supplied with a relatively low voltage $V_L$, for example 12 volts, sufficient to raise the gate electrode of T2 to a voltage, with respect to its source terminal (which is connected to ground) greater than the conduction threshold. The driving circuit DR1 of the transistor T1 is supplied with a voltage $V_c$ the value of which is substantially equal to $V_L$ provided by a "buffer" capacitor C connected between the connection node S1 (between the two transistors T1 and T2) and a charging circuit, not shown, the function of which is to maintain the capacitor C charged to the voltage $V_c$.

The level shifter LS1 includes two substantially identical circuit branches each constituted by an n channel MOS transistor M1, M2 the source terminal of which is connected to the ground terminal and the drain terminal of which is connected to the supply terminal $V_c$ via the parallel connection of a resistor R1, R2 and a zener diode D1, D2. The gate terminals of the transistors M1 and M2 are connected to an output of the logic circuit LG, one directly and the other through an inverter INV1, such that the control signals which arrive at the two transistors are always complementary to one another.

The level shifter LS1 also includes a bistable (flip-flop) circuit, indicated as RS, supplied with the voltage $V_c$, and having "set" and "reset" terminals S, R respectively, connected via respective inverters INV2 and INV3 to the drain electrodes, respectively, of transistors M1 and M2, and an output terminal Q connected to the input of the driving circuit DR1 of transistor T1. The logic operations of the R-S flip-flop are set forth in the following truth table.

| Rn | Sn | Qn + 1 |
|---|---|---|
| 0 | 0 | Qn |
| 0 | 1 | 1 |
| 1 | 0 | 0 |
| 1 | 3 1 | Indeterminate |

In operation, the two transistors M1 and M2 are alternately brought to a conduction state by signals generated by the logic circuit LG. The current pulses which form in succession in the two resistors R1 and R2 produce the "set" and "reset" signals at the inputs S and R of the flip-flop RS. Consequently, the voltage level of the output signal Q from the flip-flop, relative to the voltage level of the node S1 (which varies substantially between 0 and $V_H$ based on the state of conduction of the transistors of the bridge), causes the driving circuit DR1 to apply a voltage signal between the gate and source electrodes of the transistor T1, a voltage signal which switches on or off the transistor T1.

The circuit described above can be improved, in a manner which will be illustrated hereinbelow, to ensure that during switching of the node S1 between 0 and $V_H$, both the inputs of the flip-flop are at low level. However, both the circuit of FIG. 1 and the thus-improved circuit are subject, when formed as part of a monolithic integrated circuit, to possible spurious switching such that they cannot be utilized when it is essential to achieve absolute security in operation of the transistor bridge.

Spurious switching is due to the structure capacitances associated with the transistors M1 and M2. These capacitances, generally indicated as C1 and C2 in FIG. 1, are the sum of the capacitances between drain and source and between drain and substrate. In certain conditions, as will be explained in more detail hereinbelow in relation to a particular circuit, during discharge of these capacitances, which takes place in part through the Zener diodes, D1 and D2 and in part through the resistors R1 and R2, the conduction of parasitic components is triggered due to the structure of the integrated circuit in which the various components of the switching control circuit are formed, which can lead to switching signals at the flip-flop which are not those caused by the control signal and which can therefore cause very serious malfunctions.

The object of the present invention is to provide a switching control circuit with a level shifter for an electronic power switch in which spurious switching is not possible in any case.

SUMMARY OF THE INVENTION

According to the principles of the present invention, an integrated control circuit for switching an electronic power switch for driving a load device is provided. The integrated control circuit comprises a control logic circuit that produces two different voltage levels, and a level shifter whose input is connected to the control logic circuit. Based on the output of the control logic circuit, the level shifter produces two different shifted voltage levels for controlling the electronic power switch connected to the load device. The load device, for example, may be a winding of an electric motor. The level shifter includes a bistable stage and a switch. The bistable stage has first and second inputs controlled by the control logic circuit. The output of the bistable stage is switched in a predetermined sequence based on the first and second inputs. According to one aspect of the present invention, the switch in the level shifter is connected between the first input and the load device. The switch also has an input connected to the second input. The switch turns on when the voltage level of the second input is greater than the voltage level of the load device. This is done to maintain the second input substantially at the voltage level of the load device.

BRIEF DESCRIPTION OF THE DRAWINGS

The invention will be better understood from the following detailed description of an exemplary, and therefore non-limiting embodiment in relation to the attached drawings, in which.

DETAILED DESCRIPTION OF THE INVENTION

Figure 1:
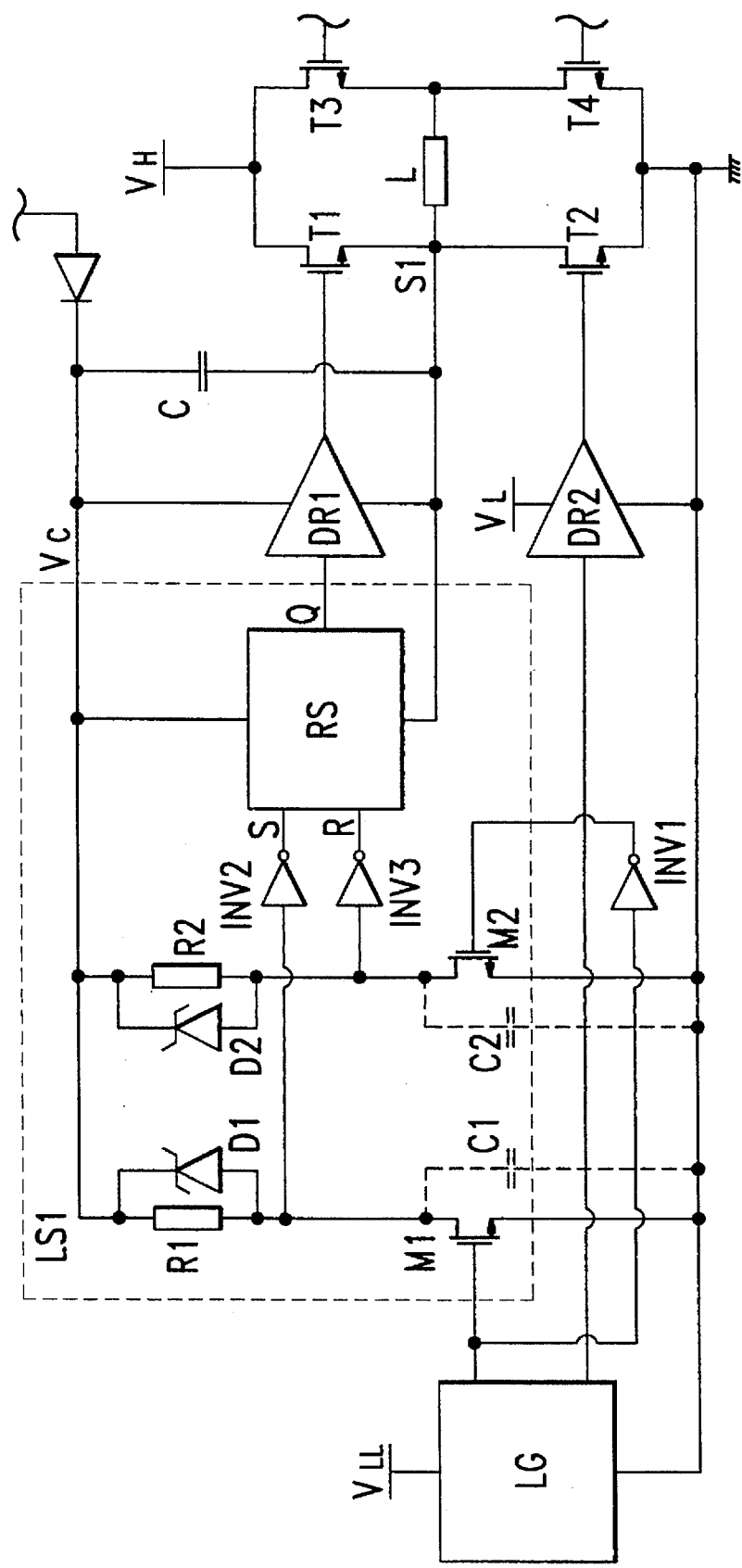
FIG. 1 is a diagram of a prior art switching control circuit applied to a transistor bridge.
Figure 2:
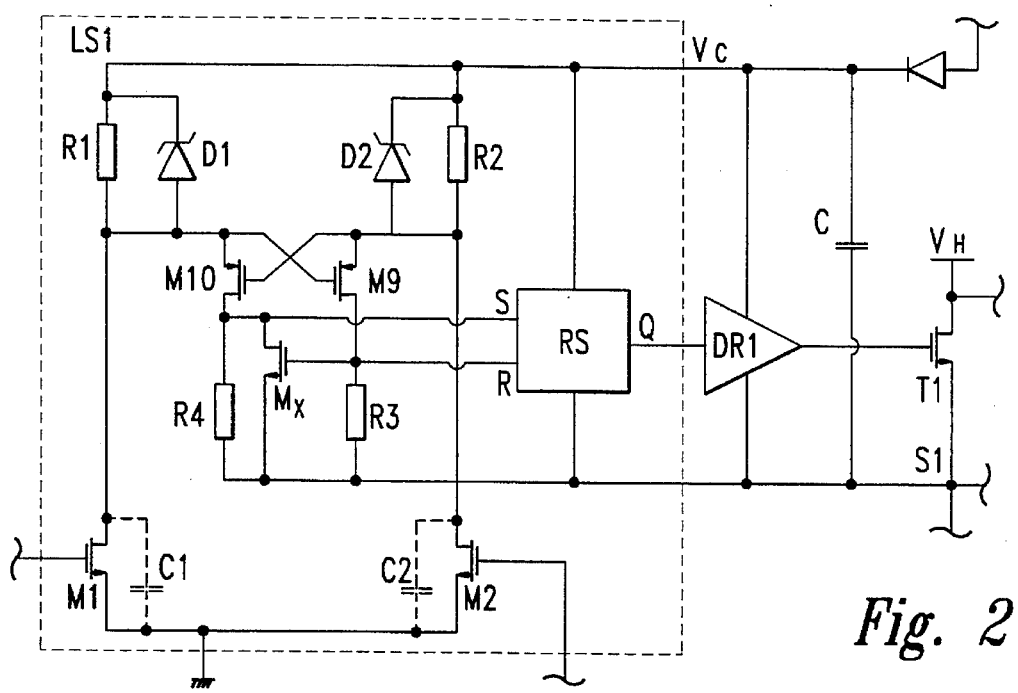
FIG. 2 is a diagram of a switching control circuit according to the invention.

The circuit of FIG. 2, in which parts which are the same as or correspond to those of FIG. 1 are indicated with the same reference symbols, is different from that of FIG. 1 substantially in that the input terminals S and R of the flip-flop RS are not connected to the drain electrodes of the transistors M1 and M2 through inverters, but through a coupling stage which comprises two p channel MOSFETs, indicated as M9 and M10. These are each connected with a respective series resistor R3 and R4 between the drains of the transistors M2 and M1 and the node S1, and have their gate electrodes connected to the source electrode of the other transistor of the pair.

The current injected alternately into the resistors R1 and R2 during conduction of the transistors M1 and M2 respectively, causes conduction of the transistors M9 or M10 respectively such that across the resistors R3 or R4 there is a voltage drop which gives rise to the "reset" or "set" signals on the flip-flop RS. This circuit offers the advantage over the circuit of FIG. 1 of maintaining the condition of low level signals S=0, R=0 on both inputs of the flip-flop during switching of the node S1. This is important in particular when the node S1 switches to a high voltage level, that is to say varies from 0 to $V_H$.

Figure 3:
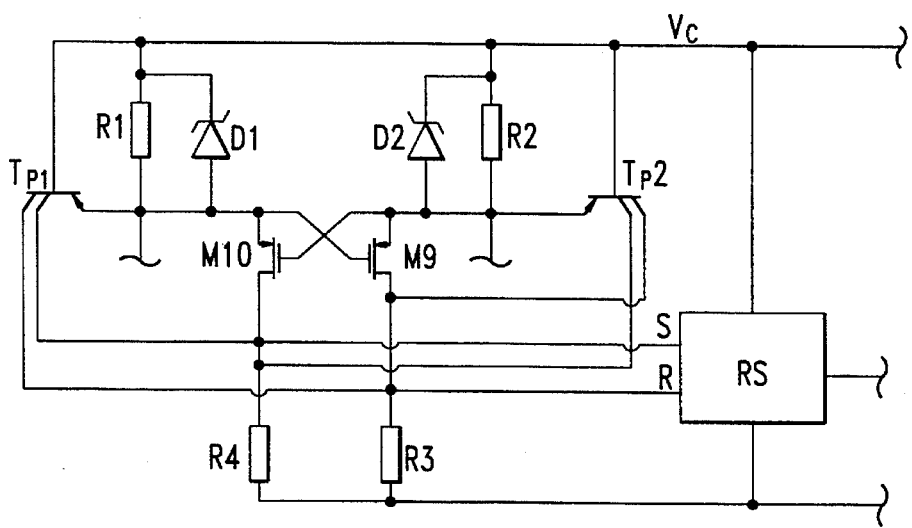
FIG. 3 is a detailed diagram of a portion of the circuit of FIG. 2 in which parasitic components not shown in FIG. 2 are illustrated.
Figure 4:
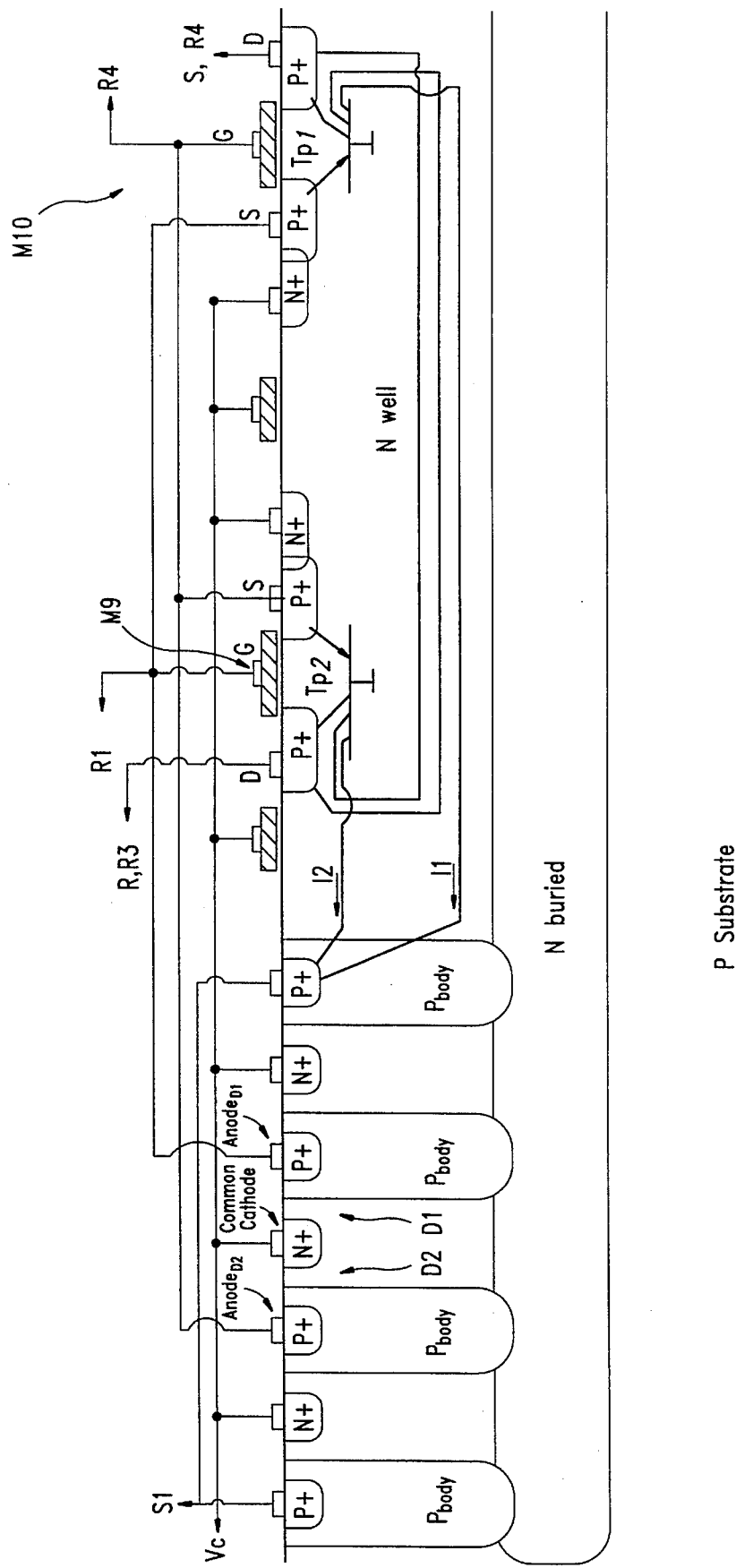
FIG. 4 is a cross-sectional view of a portion of the circuit of FIG. 3 and illustrates the parasitic components.

However, discharge of the capacitances C1 and C2 can cause spurious signals. In particular, if the circuit of FIG. 2 is made as an integrated circuit using conventional fabrication techniques, parasitic bipolar transistors of pnp type are formed the effect of which can be evaluated by examining the equivalent diagram of FIG. 3 and the cross-sectional view of the parasitic transistors in FIG. 4. As is seen, FIGS. 3 and 4 show two double collector transistors indicated as Tp1 and Tp2, each having its emitter region in common with the source region of a respective p channel MOSFET transistor M10 and M9, its base region connected to the supply terminal $V_c$ and two collector regions in common with the drain regions of M10 and M9 which are connected to the input terminals S and R of the flip-flop. In the discharge phase of the capacitances C1 and C2, the two transistors Tp1 and Tp2 inject a current into the resistors R3 and R4. This takes place, in particular, in the switching phase of the node S1 from the higher level to the lower level when the power transistors T1 and T2 are, respectively, off and on. In this phase both the inputs of the flip-flop are at the higher level, that is to say in a state which does not in general correspond to a well defined output state of the flip-flop. To prevent this condition from causing an output of the flip-flop corresponding to a switching on of the power transistor T1, it is advisable to utilize a flip-flop of the "dominant reset" type, that is to say the type that has a low output level when the inputs are both at high level.

However, even in this case, at the end of the transition of the node S1 from $V_H$ to 0 with the transistor T1 in the cut-off state, there is the risk that the flip-flop will receive an input condition which would take the transistor T1 back into conduction during the conduction of the lower transistor T2, this situation being highly undesirable. In fact, the voltage levels on the inputs S and R of the flip-flop, once the parasitic injection has ceased, tend to fall to the level of the node S1 so that the capacitances associated with the two terminals S and R discharge gradually through the resistors R4 and R3 until the so-called memory state (S=0, R=0) of the flip-flop is reached. In this condition, the output state Q will be determined by that of the two levels which falls fastest. For example, in the case of a more rapid fall of the input R there would be the unwanted condition S=1, R=0 which would take the power transistor T1 into conduction.

To prevent this condition from occurring, according to the invention there is provided an electronic switch, in this example an n channel MOSFET transistor indicated as Mx (FIG. 2), connected between the S input of the flip-flop and the node S1 and having its gate electrode connected to the R input of the flip-flop. The function of the transistor MX is that of holding the S input at the level of the node S1 during the switching phase. In fact, suppose that there is an injection of charge both on the resistor R4 and on the resistor R3. As soon as the voltage drop on R3 exceeds the conduction threshold of the transistor Mx, this transistor goes into conduction and brings the level of the S input to the level of the node S1. Once the change injection ceases, the input conditions of the flip-flop cannot be other than S=0, R=1, that is to say those which cause the cut-off state of the power transistor T1.

As can be easily established, the object of the invention is fully achieved in that the risk of spurious switching is entirely avoided. From the constructional point of view this involves an advantage in terms of compactness of the integrated circuit and freedom from design constraints. In fact, to attenuate the damaging effect of the parasitic pnp transistors, it would often be necessary otherwise to increase the area of the integrated circuit and/or to provide particular circuit arrangements.

The foregoing specific embodiments represent just some of the ways of practicing the present invention. Many other embodiments are possible within the spirit of the invention. Accordingly, the scope of the invention is not limited to the foregoing specification, but instead is given by the appended claims along with their full range of equivalents.

We claim:

1. An integrated control circuit for switching an electronic power switch, comprising:
    a control logic circuit for producing first and second voltage levels; and
    a level shifter having an input connected to the control logic circuit and an output connected to the electronic power switch, the level shifter including
    a bistable stage having first and second inputs, and an output defining the output of the level shifter; and
    a switch having an input connected to the second input, the switch being connected between the first input and a connection node, wherein the switch turns on when the voltage level at the second input is greater than the voltage level at the connection node.

2. The circuit according to claim 1 wherein the switch includes an N channel MOS transistor.

3. The circuit according to claim 1 wherein the bistable stage includes a flip-flop.

4. The circuit according to claim 3 wherein the flip-flop is of a dominant reset type having set and reset inputs and wherein the set input corresponds to the first input and the reset input corresponds to the second input.

5. The circuit according to claim 1 wherein the level shifter further includes:
    a first circuit branch having an output connected to the first input, and including a first transistor and a first resistor connected between the first transistor and the connection node; and
    a second circuit branch having an output connected to the second input, and including a second transistor and a second resistor connected between the second transistor and the connection node, the first and second transistors being switched alternately based on the first and second voltage levels produced by the control logic circuit.

6. The circuit according to claim 5 wherein the first and second transistors are cross coupled to each other.

7. The circuit according to claim 6 wherein the first circuit branch further includes:
    a third transistor connected to the first transistor and controlled by the control logic circuit;
    a third resistor connected to the first transistor; and
    a first diode connected in parallel with the third resistor; and wherein the second circuit branch further includes:
    a fourth transistor connected to the second transistor and controlled by the control logic circuit;
    a fourth resistor connected to the second transistor; and
    a second diode connected in parallel with the fourth resistor, the third transistor and the fourth transistor receiving complementary signals from each other.

8. An integrated control circuit for switching an electronic power switch, comprising:
    a control logic circuit for producing first and second voltage levels; and
    a level shifter having an input connected to the control logic circuit and an output connected to the electronic power switch, the level shifter including
    a bistable stage having first and second inputs, and an output defining the output of the level shifter;
    a first circuit branch having an output connected to the first input, and including a first transistor and a first resistor connected between the first transistor and a connection node;
    a second circuit branch having an output connected to the second input, and including a second transistor and a second resistor connected between the second transistor and the connection node, the first and second transistors being switched alternately based on the first and second voltage levels produced by the control logic circuit; and
    means for maintaining the first input at substantially the same voltage level as the voltage level at the connection node during the switching of the electronic power switch.

9. The circuit according to claim 8 wherein the means for maintaining includes a switch having an input connected to the second input, the switch being connected between the first input and the connection node, wherein the switch turns on when the voltage level at the second input is greater than the voltage level at the connection node.

10. The circuit according to claim 9 wherein the switch includes an N channel MOS transistor.

11. A switching control circuit for an electronic power switch connected in series with a load between first and second supply terminals comprising
    a control logic circuit adapted to produce an output signal having two voltage levels referred to the voltage level of a reference terminal,
    a level shift circuit the input of which is connected to the output of the control logic circuit and an output of which is connected to the control terminal of the electronic switch, and adapted to produce at its output a signal having two voltage levels, corresponding to the signal from the control logic circuit, relative to the voltage level of the connection node between the electronic switch and the load,
    this level shift circuit comprising
    a bistable stage having two inputs and one output, which is the output of the level shift circuit, and
    a supplementary electronic switch connected between one of the two inputs of the bistable stage and said connection node and having a control terminal connected to the other of the two inputs of the bistable stage, in such a way as to be closed when the other of the two inputs of the bistable stage is at a voltage level greater than that of the connection node.

12. A circuit according to claim 11, in which the bistable stage is of the "dominant reset" type.

13. A circuit according to claim 11, in which the level shift circuit comprises two substantially identical circuit branches each including an n channel MOSFET transistor having its source terminal connected to the first supply terminal, its drain terminal connected to a third supply terminal via the parallel connection of a resistor and a diode and its gate terminal connected to one output of the logic circuit, in such a way that the control signals applied to the gate terminals are complementary to one another, the drain terminals being coupled each to an input terminal of the said bistable stage.

14. A circuit according to claim 13, in which the coupling between the drain terminals of the MOSFET transistors and the input terminals of the bistable stage is achieved by means of two p channel MOSFET transistors each having a source terminal connected to the drain terminal of a respective n channel MOSFET transistor, a drain terminal connected to the connection node via a resistor, and a gate terminal connected to the drain terminal of the other n channel MOSFET transistor, the drain terminals of the two p channel MOSFET transistors being connected to the input terminals of the bistable stage.

15. A circuit according to claim 11, in which the electronic switch is an n channel MOSFET transistor the gate terminal of which is the control terminal of the switch itself.

* * * * *